United States Patent [19]

Soleimani et al.

[11] Patent Number: 5,330,920
[45] Date of Patent: Jul. 19, 1994

[54] METHOD OF CONTROLLING GATE OXIDE THICKNESS IN THE FABRICATION OF SEMICONDUCTOR DEVICES

[75] Inventors: Hamid R. Soleimani, Westborough; Brian S. Doyle, Framingham, both of Mass.; Ara Philipossian, Redwood Shores, Calif.

[73] Assignee: Digital Equipment Corporation, Maynard, Mass.

[21] Appl. No.: 77,570

[22] Filed: Jun. 15, 1993

[51] Int. Cl.$^5$ ............................................. H01L 21/265
[52] U.S. Cl. ................................. 437/24; 437/28; 437/29; 437/25; 437/42; 148/DIG. 118; 148/DIG. 163
[58] Field of Search ................ 437/24, 25, 28, 29, 437/42, 41; 148/DIG. 163, DIG. 112, DIG. 118

[56] References Cited

U.S. PATENT DOCUMENTS

| | | | |
|---|---|---|---|
| 3,982,967 | 9/1976 | Ku et al. | 148/1.5 |
| 4,098,618 | 7/1978 | Crowder et al. | 148/1.5 |
| 4,356,041 | 10/1982 | Kosa | 148/1.5 |
| 4,411,929 | 10/1983 | Sato et al. | 427/38 |
| 4,945,068 | 7/1990 | Sugaya | 437/24 |

FOREIGN PATENT DOCUMENTS

| | | | |
|---|---|---|---|
| 0037830 | 3/1982 | Japan | 437/24 |
| 0054638 | 3/1983 | Japan | 437/24 |
| 0300518 | 12/1988 | Japan | 437/24 |
| 0040431 | 2/1991 | Japan | 437/24 |

*Primary Examiner*—Brian E. Hearn
*Assistant Examiner*—Tuan Nguyen
*Attorney, Agent, or Firm*—Robert J. Feltovic; Denis G. Maloney; Albert P. Cefalo

[57] ABSTRACT

A method of controlling gate oxide thickness in the fabrication of semiconductor devices wherein a sacrificial gate oxide layer is formed on a semiconductor substrate surface. Nitrogens ions are implanted into select locations of the substrate through the sacrificial gate oxide layer, and the substrate and the gate oxide layer are then thermally annealed. The sacrificial gate oxide layer is then removed and a gate oxide layer is then formed on the substrate layer wherein the portion of the gate oxide layer formed on the nitrogen ion implanted portion of the substrate is thinner than the portion of the gate oxide layer formed on the non-nitrogen ion implanted portion.

6 Claims, 2 Drawing Sheets

METHOD OF CONTROLLING GATE OXIDE THICKNESS IN THE FABRICATION OF SEMICONDUCTOR DEVICES

FIELD OF THE INVENTION

The present invention relates generally to the manufacture of semiconductor devices, and more particularly, to methods of controlling gate oxide thickness in the fabrication of semiconductor devices.

BACKGROUND OF THE INVENTION

Semiconductor chips typically have gate oxide layers of a single thickness. However, it is sometimes preferable to have gate oxide layers of varying thicknesses on a single chip. For example, input-output drivers normally are subjected to a higher supply of voltage entering externally to the chip. The use of thicker gate oxides would prevent these devices from having unacceptably short time dependent dielectric breakdown (TDDB) characteristics, and also reduce the possibility of needing to add circuitry to the chip to avoid early TDDB failure.

Current methods require a complicated procedure in order to produce a semiconductor chip having varying gate thicknesses. First, a gate oxide layer is grown on the semiconductor chip surface. A portion of this gate oxide layer must then be masked. The mask can be used either to slow the growth of the gate oxide layer on the masked portion of the chip surface or to isolate the masked area while the unmasked portion of the gate oxide layer is further reduced.

Two major problems are associated with the use of this masking technique to produce different gate oxide thicknesses on a single chip. First, the use of the mask can cause contamination problems in the gate oxide layer. Any impurities in the gate oxide layer may affect the performance of the gate oxide layer and consequently the performance of the entire chip. Second, the use of a masking technique requires additional process steps which are costly and time-consuming. Accordingly, there is a need for a process of controlling gate oxide thickness in the fabrication of semiconductor devices which overcomes the above-mentioned deficiencies.

SUMMARY OF THE INVENTION

The present invention provides a method of controlling gate oxide thickness in the fabrication of semiconductor devices. The method involves forming a sacrificial gate oxide layer on select locations of a silicon semiconductor substrate surface, known as the gate oxide area. Nitrogen ions are then implanted into select locations of the gate oxide area through the gate sacrificial oxide layer. After nitrogen implantation, the substrate is thermally annealed to assist the pile-up of nitrogen ions at the silicon/oxide interface. The sacrificial gate oxide layer is then completely removed, and the silicon substrate containing the nitrogen ions is then oxidized for a sufficient period of time to form a gate oxide layer on the substrate. The nitrogen implanted regions of the substrate will have thinner gate oxide layers than the non-implanted regions due to a reduction in the growth rate of the nitrogen implanted region as compared to the non-implanted regions.

BRIEF DESCRIPTION OF THE DRAWINGS

The following detailed description, which sets forth other advantages of the present invention, refers to the accompanying drawings in which the elements have been given reference numerals. These drawings, which are not drawn to scale, are briefly described below.

DETAILED DESCRIPTION OF THE PREFERRED EMBODIMENTS

The method of the present invention is described in the context of forming gate oxide layers of various thicknesses on a silicon substrate by way of example only. It will be apparent to one skilled in the art that the present invention is not limited to the specific embodiment of FIGS. 1-5, but is equally adaptable to other substrates.

Figure 1:
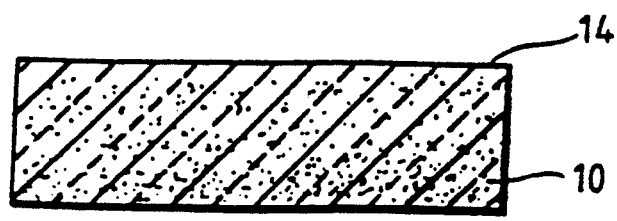
FIGS. 1-6 are diagrammatic cross-sectional views showing successive stages of processing of a semiconductor wafer having varying gate oxide layer thicknesses.
Figure 2:
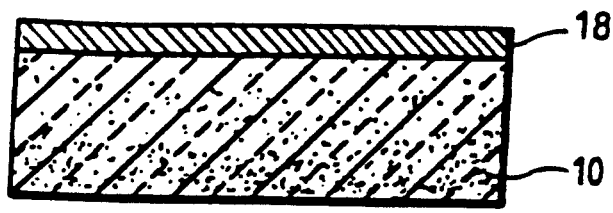

Referring now to the drawings, FIG. 1 shows a silicon semiconductor substrate 10. In the method of the present invention, a thermal oxide layer, typically about 1000 Å thick, is grown on the top surface 14 of the substrate 10. This thermal oxide layer may be grown by various methods known to those skilled in the art. In a typical method, the thermal oxide layer is grown by heating the substrate 10 to a temperature of from about 800° C. to about 1000° C. and then subjecting the substrate to oxidation. The substrate 10 is then laser scribed and the thermal oxide layer is completely etched back using, for example, a 10:1 HF etch. This initial thermal oxide layer is grown on the substrate 10 to prepare the silicon substrate surface 14 by forming $SiO_2$ and to help remove any defects from the substrate.

A sacrificial thermal oxide layer 18 is then grown on the substrate 10. This thermal oxide layer 18 can be of varying thickness, although it is typically about 150 Å thick. This sacrificial thermal oxide layer 18 may likewise be grown on the substrate 10 by various methods known to those skilled in the art, such as by heating and oxidizing the substrate 10 as described above.

Figure 3:
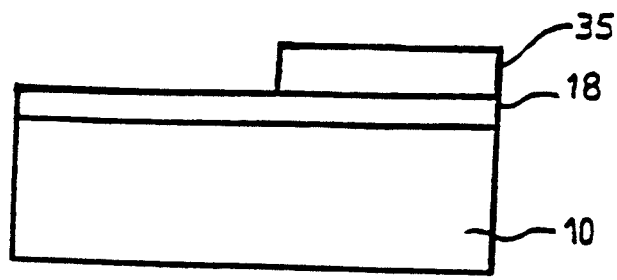

A masking layer 35 is now applied using a resist or other masking materials (FIG. 3). Nitrogen ions will be implanted into selected regions of this layer and these regions are then etched.

Figure 4:
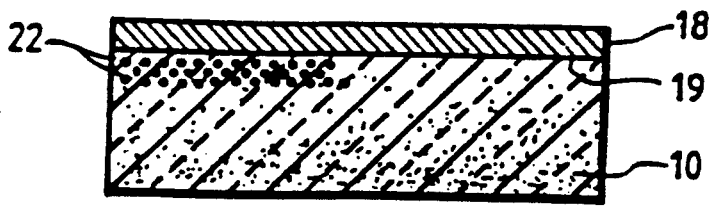
Figure 5:
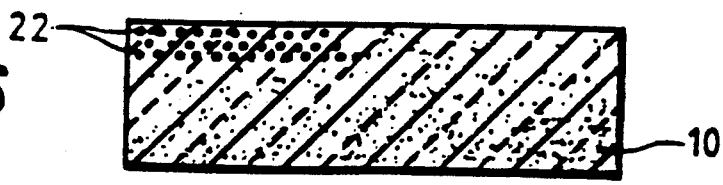
Figure 6:
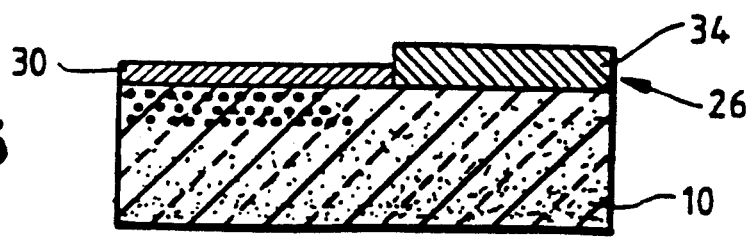

Referring to FIG. 4, nitrogen ions ($N_2+$) 22 are implanted such that the ions do not penetrate the masked region (FIG. 3) but do penetrate into the sacrificial oxide layer 18 and the silicon substrate 10 in the unmasked regions. Nitrogen ions are implanted with doses ranging from about $10^{13}$ ions per $cm^2$ to about $10^{17}$ ions per $cm^2$ at an energy of between about 10 to about 50 keV. The nitrogen ion dosage can vary depending upon the thickness of the gate oxide layer 18.

After nitrogen ion implantation is completed, the mask is then removed and the nitrided gate oxide layer is thermally annealed at a temperature of about 950° C. for about 10 minutes. The time and temperature of the anneal can vary, while providing substantially the same results. Typically, the thermal annealing step can be carried out from between about 800 and 1100° C. for between about 1 and about 90 minutes. Thermal annealing helps to diffuse the nitrogen ions in the substrate 10, and assists in the pile-up of the nitrogen ions at the $Si$-$SiO_2$ interface 19 (See FIG. 4). Following annealing, the sacrificial gate oxide layer 18 is then removed by chemical etching, for example using a 10:1 HF solution. (See FIG. 5).

The desired gate oxide layer 26 is then grown on the silicon substrate 10. The gate oxide layer 26 can be grown on the substrate 10 by a variety of methods known to those skilled in the art. However, the layer is typically grown on the substrate 10 by heating the substrate to a temperature of from between about 800 to about 1000° C. and subjecting the substrate 10 to an oxidizing ambient, such as wet or dry $O_2$. Following oxidation, the gate oxide layer grown on the nitrogen ion implanted portion 30 of the substrate 10 will be thinner than the gate oxide layer of the non-implanted portion 34 of the substrate. This is due to the fact that the nitrogen ions cause a significant reduction in the growth rate of the gate oxide layer grown on the nitrogen ion implanted portion 30 compared to the non-implanted portion 34. Thus, gate oxide layers of varying thicknesses are formed on a single substrate.

While the inventive system has been particularly shown and described with reference to these various embodiments, it will be recognized by those skilled in the art that modifications and changes may be made to the present invention without departing from the spirit and scope thereof, which is set forth in the following claims.

What is claimed is:

1. A method of controlling gate oxide thickness in the fabrication of semiconductor devices comprising:

forming a sacrificial gate oxide layer on select locations of a semiconductor substrate surface;

implanting nitrogen ions into the select locations of the substrate through the sacrificial gate oxide layer;

thermally annealing the substrate and sacrificial gate oxide layer to assist pile-up of the nitrogen ions at the semiconductor substrate surface;

removing the sacrificial gate oxide layer; and thermally forming a gate oxide layer on the silicon semiconductor substrate surface, wherein the select locations having nitrogen ion implanted will have a thinner gate oxide layer than a non-implanted region.

2. The method of claim 1 wherein the semiconductor substrate is silicon.

3. The method of claim 1 further comprising the steps of forming oxide layers on select locations of a semiconductor substrate surface and removing said oxide layers prior to forming said sacrificial gate oxide layer on select locations of the semiconductor substrate surface.

4. The method of claim 1 wherein the nitrogen ions are implanted into select locations of the substrate at a dose of from about $10^{13}$ to about $10^{17}$ ions per cm$^2$.

5. The method of claim 1 wherein the substrate and the sacrificial gate oxide layer are annealed at a temperature of from about 800° to about 1100° C. for about 1 to about 90 minutes.

6. The method of claim 1 wherein the gate oxide layer is thermally formed by subjecting the silicon conductor substrate surface to oxidation in dry $O_2$ at a temperature from about 800° to about 1000° C. for about 5 to about 20 minutes.

* * * * *